(12) United States Patent
Park et al.

(10) Patent No.: US 9,368,280 B2
(45) Date of Patent: Jun. 14, 2016

(54) MULTI-LAYERED CAPACITOR AND CIRCUIT BOARD MOUNTED WITH MULTI-LAYERED CAPACITOR

(71) Applicant: SAMSUNG ELECTRO-MECHANICS CO., LTD., Suwon (KR)

(72) Inventors: Min Cheol Park, Suwon (KR); Young Ghyu Ahn, Yongin (KR); Sang Soo Park, Suwon (KR); Joon Yeob Cho, Seoul (KR)

(73) Assignee: SAMSUNG ELECTRO-MECHANICS CO., LTD., Suwon-Si, Gyeonggi-Do (KR)

( * ) Notice: Subject to any disclaimer, the term of this patent is extended or adjusted under 35 U.S.C. 154(b) by 204 days.

(21) Appl. No.: 14/075,544

(22) Filed: Nov. 8, 2013

(65) Prior Publication Data

US 2014/0196937 A1 Jul. 17, 2014

(30) Foreign Application Priority Data

Jan. 15, 2013 (KR) .................. 10-2013-0004439

(51) Int. Cl.
| | |
|---|---|
| *H01G 4/12* | (2006.01) |
| *H05K 3/34* | (2006.01) |
| *H01G 4/30* | (2006.01) |
| *H01G 4/38* | (2006.01) |

(52) U.S. Cl.
CPC ............ *H01G 4/1227* (2013.01); *H01G 4/1236* (2013.01); *H01G 4/30* (2013.01); *H01G 4/385* (2013.01); *H05K 3/3442* (2013.01); *H05K 3/3463* (2013.01); *H05K 2201/10015* (2013.01); *H05K 2201/2045* (2013.01); *Y02P 70/613* (2015.11)

(58) Field of Classification Search
CPC ..... H01G 4/12; H01G 4/1209; H01G 4/1218; H01G 4/1227
See application file for complete search history.

(56) References Cited

U.S. PATENT DOCUMENTS

| | | | | |
|---|---|---|---|---|
| 5,737,180 | A * | 4/1998 | Yoo .................... | H01G 4/06 361/303 |
| 6,437,969 | B2 * | 8/2002 | Mizuno et al. ................ | 361/311 |
| 8,450,230 | B2 * | 5/2013 | Tamura et al. ................ | 501/139 |
| 8,778,502 | B2 * | 7/2014 | Sugimoto ............... | B32B 18/00 428/432 |
| 9,076,597 | B2 * | 7/2015 | Inazuka et al. | |
| 2010/0302703 | A1 * | 12/2010 | Hwang ................... | 361/305 |
| 2011/0141660 | A1 * | 6/2011 | Jeong et al. ................ | 361/321.4 |
| 2013/0050894 | A1 * | 2/2013 | Ahn et al. .................. | 361/306.3 |
| 2013/0250473 | A1 * | 9/2013 | Bultitude et al. .......... | 361/301.4 |
| 2013/0314841 | A1 * | 11/2013 | Oguni ....................... | 361/301.4 |
| 2013/0321981 | A1 * | 12/2013 | Ahn et al. .................. | 361/321.2 |

(Continued)

FOREIGN PATENT DOCUMENTS

| | | | | |
|---|---|---|---|---|
| JP | 2005268712 A | * | 9/2005 | ............... H01G 4/12 |
| KR | 10-2010-0066080 | | 6/2010 | |

*Primary Examiner* — Jeremy C Norris
*Assistant Examiner* — Nathan Milakovich
(74) *Attorney, Agent, or Firm* — McDermott Will & Emery LLP

(57) ABSTRACT

Disclosed herein is a multi-layered capacitor, including: an element formed by alternately multi-layering a dielectric layer and an internal electrode; and external terminals disposed at both ends of the element, wherein the dielectric layer disposed at an upper end U and a lower end L of the element is formed of a paraelectric material and the dielectric layer disposed at a central part C of the element is formed of a ferroelectric material.

18 Claims, 2 Drawing Sheets

(56) References Cited

U.S. PATENT DOCUMENTS

| | | | |
|---|---|---|---|
| 2015/0016015 A1* | 1/2015 | Lee et al. | 361/301.4 |
| 2015/0062775 A1* | 3/2015 | Shibasaki et al. | 361/301.4 |
| 2015/0124372 A1* | 5/2015 | Park et al. | 361/301.4 |
| 2015/0131199 A1* | 5/2015 | Park et al. | 361/301.4 |

* cited by examiner

MULTI-LAYERED CAPACITOR AND CIRCUIT BOARD MOUNTED WITH MULTI-LAYERED CAPACITOR

CROSS REFERENCE(S) TO RELATED APPLICATIONS

This application claims the benefit under 35 U.S.C. Section 119 of Korean Patent Application Serial No. 10-2013-0004439 entitled "Multi-Layered Capacitor And Circuit Board Mounted With Multi-Layered Capacitor" filed on Jan. 15, 2013, which is hereby incorporated by reference in its entirety into this application.

BACKGROUND OF THE INVENTION

1. Technical Field

The present invention relates to a multi-layered capacitor, and more particularly, to a multi-layered capacitor mounted with a vibration preventing device.

2. Description of the Related Art

In general, a multi-layered ceramic capacitor (MLCC) is a chip type capacitor that is mounted on a printed circuit board of various electronic products, such as mobile communication terminals, notebooks, computers, and personal digital assistants (PDAs), to perform an important role of charging or discharging electricity and has various sizes and multi-layered types according to the usage and capacity thereof.

In general, the multi-layered ceramic capacitor has a structure in which an internal electrode is alternately multi-layered between a plurality of dielectric layers.

The multi-layered ceramic capacitor can achieve advantages, such as miniaturization and implementation of high capacity, easiness of mounting, and therefore has been widely used as a component of various electronic devices.

As a ceramic material forming an element of the multi-layered ceramic capacitor, a ferroelectric material, such as barium titanate, having relatively high dielectric constant has been generally used. Since the ferroelectric material has piezoelectricity and electrostrictive property, when electric field is applied to the ferroelectric material, stresses and mechanical deformations are shown as vibrations, which are delivered to a circuit board side from a terminal electrode of the multi-layered ceramic capacitor to a circuit board side.

That is, when alternating voltage is applied to the multi-layered ceramic capacitor, stresses Fx, Fy, and Fz are generated in an element body of the multi-layered ceramic capacitor according to each direction and vibrations are generated accordingly. These vibrations are delivered from the terminal electrode to the circuit board, such that the overall circuit board becomes an acoustic radiating surface and a vibrating sound that is noise is generated.

In the vibrating sound, the vibrating sound in an audible frequency band (20 to 20000 Hz) is problematic, which should be essentially solved.

Recently, in order to solve the problem due to the vibrating sound, technologies for preventing vibrations by elastically deforming an external terminal of the multi-layered ceramic capacitor have been introduced.

In addition, as disclosed in Korean Patent Laid-Open Publication No. 10-2010-0066080, various technologies, such as a technology for using a separate component to suppress a propagation of vibrations generated due to piezoelectric and electrostrictive properties and reduce a generation of noise and a technology of forming circuit board holes around a mounted multi-layered ceramic capacitor to suppress vibrations of a circuit board, have been introduced; however, these technologies require a separate process and cannot sufficiently obtain the sufficient anti-vibration effect compared to the complexity of the process. Therefore, a technology of prevent vibrations with a simpler structure has been urgently required.

RELATED ART DOCUMENT

Patent Document (Patent Document 1) Korean Patent Laid-Open Publication No. 10-2010-0066080

SUMMARY OF THE INVENTION

An object of the present invention is to provide a multi-layered capacitor with improved productivity while being manufactured at low cost, by suppressing vibrations due to piezoelectricity of a ferroelectric material with a simpler structure and reducing complexity of a process without using a separate process.

According to an exemplary embodiment of the present invention, there is provided a multi-layered capacitor, including: an element formed by alternately multi-layering a dielectric layer and an internal electrode; and external terminals disposed at both ends of the element, wherein the dielectric layer disposed at an upper end U and a lower end L of the element is formed of a paraelectric material and the dielectric layer disposed at a central part C of the element is formed of a ferroelectric material.

The ferroelectric material may include any one selected from a group consisting of barium titanate ($BaTiO_3$)-based ceramics, Pb-based composite perovskite-based ceramics, strontium titanate ($SrTiO_3$)-based ceramics or a mixture of two or more thereof.

The paraelectric material may include any one selected from a group consisting of potassium zirconate ($CaZrO_3$)-based ceramics, barium zirconate ($BaZrO_3$)-based ceramics, and strontium zirconate ($SrZrO_3$)-based ceramic or a mixture of two or more thereof.

The relationship among a thickness $T_{UPPER}$ of the upper end U, a thickness $T_{LOWER}$ of the lower end L, and a thickness $T_{CENTER}$ of the central part C of the element may satisfy the following Equation.

$$(T_{UPPER}T_{LOWER}):T_{CENTER}=1:1 \text{ to } 1:1.5.$$

The upper end U of the element may include a margin layer M11 formed of only the paraelectric material.

The lower end L of the element may include a margin layer M12 formed of only the paraelectric material.

The upper end U of the element may include a margin layer M11 formed of only the paraelectric material and the lower end L of the element may include a margin layer M12 formed of only the paraelectric material.

The margin layer M11 or the margin layer M12 may be formed by multi-layering the dielectric layer formed of the paraelectric material in plural.

According to another exemplary embodiment of the present invention, there is provided a circuit board mounted with a multi-layered capacitor, wherein in a circuit board mounting structure of the multi-layered capacitor, the multi-layered capacitor includes an element formed by alternately multi-layering a dielectric layer and an internal electrode; and external terminals disposed at both ends of the element, the dielectric layer disposed at an upper end U and a lower end L of the element is formed of paraelectric material and the dielectric layer disposed at a central part C of the element is formed of a ferroelectric material, and the external terminal is conductively connected with a land disposed in the circuit board via a conductive material.

The relationship between a thickness $T_{LOWER}$ of the lower end L of the element and a height $H_{SOLDER}$ of the conductive material may satisfy the following Equation.

$$T_{LOWER}:H_{SOLDER}=0.5:1 \text{ to } 1:1.$$

According to still another exemplary embodiment of the present invention, there is provided a multi-layered capacitor, including: a capacity portion C formed by alternately multi-layering a dielectric layer formed of a ferroelectric material and an internal electrode; margin portions M21 and M22 disposed on upper and lower parts of the capacity portion C and formed of paraelectric material; and external terminals disposed at both ends of an element configured of the capacity portion C and the margin portions M21 and M22.

The ferroelectric material may include any one selected from a group consisting of barium titanate ($BaTiO_3$)-based ceramics, Pb-based composite perovskite-based ceramics, strontium titanate ($SrTiO_3$)-based ceramics or a mixture of two or more thereof.

The paraelectric material may include any one selected from a group consisting of potassium zirconate ($CaZrO_3$)-based ceramics, barium zirconate ($BaZrO_3$)-based ceramics, and strontium zirconate ($SrZrO_3$)-based ceramic or a mixture of two or more thereof.

The relationship among a thickness $T_{MARGIN21}$ of the margin portion M21, a thickness $T_{MARGIN22}$ of the margin portion M22, and a thickness $T_{CAPACITY}$ of the capacity portion C may satisfy the following Equation.

$$(T_{MARGIN21}+T_{MARGIN22}):T_{CAPACITY}=1:1 \text{ to } 1:1.5$$

According to yet another exemplary embodiment of the present invention, there is provided a circuit board mounted with a multi-layered capacitor, wherein in a circuit board mounting structure of the multi-layered capacitor, the multi-layered capacitor includes a capacity portion C formed by alternately multi-layering a dielectric layer formed of a ferroelectric material and an internal electrode; margin portions M21 and M22 disposed on upper and lower parts of the capacity portion C and formed of paraelectric material; and external terminals disposed at both ends of an element configured of the capacity portion C and the margin portions M21 and M22, and the external terminal is conductively connected with a land disposed in the circuit board via a conductive material.

The relationship between a thickness $T_{MARGIN22}$ of the margin portion M22 and a height $H_{SOLDER}$ of the conductive material may satisfy the following Equation.

$$T_{MARGIN22}:H_{SOLDER}=0.5:1 \text{ to } 1:1.$$

DESCRIPTION OF THE PREFERRED EMBODIMENTS

Figure 1:
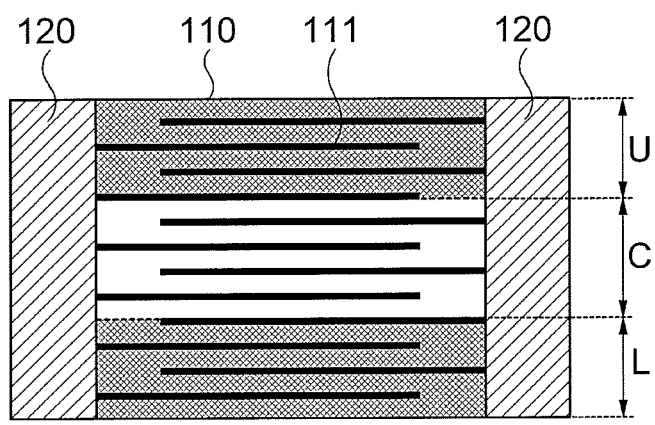
FIG. 1 is a cross-sectional view of a multi-layered capacitor according to an exemplary embodiment of the present invention.

Various advantages and features of the present invention and methods accomplishing thereof will become apparent from the following description of embodiments with reference to the accompanying drawings. However, the present invention may be modified in many different forms and it should not be limited to the embodiments set forth herein. These embodiments may be provided so that this disclosure will be thorough and complete, and will fully convey the scope of the invention to those skilled in the art. Like reference numerals throughout the description denote like elements.

Terms used in the present specification are for explaining the embodiments rather than limiting the present invention. Unless explicitly described to the contrary, a singular form includes a plural form in the present specification. The word "comprise" and variations such as "comprises" or "comprising," will be understood to imply the inclusion of stated constituents, steps, operations and/or elements but not the exclusion of any other constituents, steps, operations and/or elements.

Hereinafter, a configuration and an acting effect of exemplary embodiments of the present invention will be described in more detail with reference to the accompanying drawings.

FIG. 1 is a cross-sectional view of a multi-layered capacitor according to an exemplary embodiment of the present invention. In detail, components in the drawings are not necessarily drawn to the scale. For example, a size of a part of components in the drawing may be more exaggerated than other components so as to help the understanding of the present invention.

Referring to FIG. 1, a multi-layered capacitor 100 according to an exemplary embodiment of the present invention may include an element 110 in which a dielectric layer and an internal electrode 111 are alternately multi-layered with each other and external terminals 120 mounted at both ends of the element 110.

The element 110 may be formed by multi-layering, pressing, and sintering a plurality of dielectric layers having the internal electrode 111 printed on one surface thereof, in which the adjacent dielectric layers are integrated enough not to differentiate a boundary therebetween. Therefore, the drawings illustrate that each dielectric layer is integrally formed without being differentiated.

The internal electrode 111 is formed of a metal thin film formed by sintering a metal paste and as the metal paste, for example, metal materials, such as Ni, Pd, Ag—Pd, and Cu, may be used as a main component.

The internal electrode 111 is configured of a first internal electrode and a second internal electrode which are alternately arranged in an interlayer insulated state by the dielectric layer. In this case, sides of each internal electrode 111 are exposed to the outside of the element 110 and are bonded to the external terminal 120. For example, the first internal electrode is bonded to the external terminal 120 of any one of the pair of external terminals 120 and may be given with positive (+) polarity and the second internal electrode is bonded to the external terminal 120 of the other one thereof and may be given with negative (−) polarity. To the contrary, the first internal electrode may be given with negative (−) polarity and the second internal electrode may be given with positive (+) polarity.

The external terminal 120 is formed of metal materials, such as Cu and Ni, and a surface thereof is subjected to solder plating in order to improve solder wettability.

In general, as a ceramic material forming a body of the multi-layered capacitor, that is, the dielectric layer, a ferroelectric material having a high dielectric constant is used, but in the exemplary embodiment of the present invention, in order to suppress vibrations due to piezoelectricity of the ferroelectric material, as a material of a dielectric layer disposed on an upper end U and a lower end L of the element 110, a paraelectric material is used and as dielectrics disposed at a central part C of the element 110, a ferroelectric material is used.

In detail, as the ferroelectric material, any one selected from a group consisting of barium titanate ($BaTiO_3$)-based ceramics, Pb-based composite perovskite-based ceramics, strontium titanate ($SrTiO_3$)-based ceramics or a mixture of two or more thereof may be used, and as the paraelectric material, any one selected from a group consisting of potassium zirconate ($CaZrO_3$)-based ceramics, barium zirconate ($BaZrO_3$)-based ceramics, and strontium zirconate ($SrZrO_3$)-based ceramic or a mixture of two or more thereof may be used.

In this case, during the manufacturing process, the dielectric layers disposed at the upper end U, the lower end L, and the central part C of the element 110 are multi-layered together and simultaneously fired, such that among the foregoing materials, a material having similar firing temperature may be preferably used.

Figure 2:
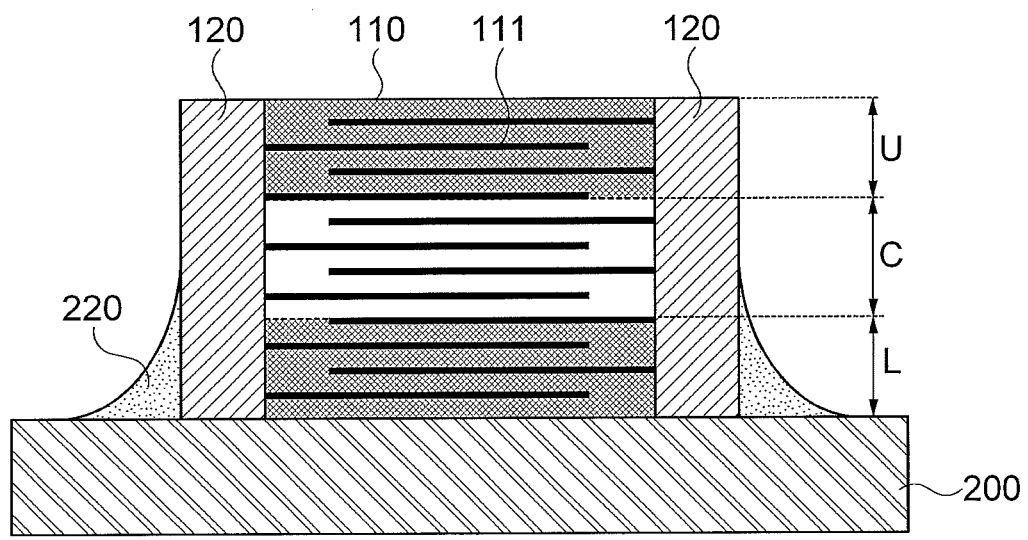
FIG. 2 is a cross-sectional view of an appearance in which the multi-layered capacitor according to the exemplary embodiment of the present invention is mounted on a circuit board.
Figure 3:
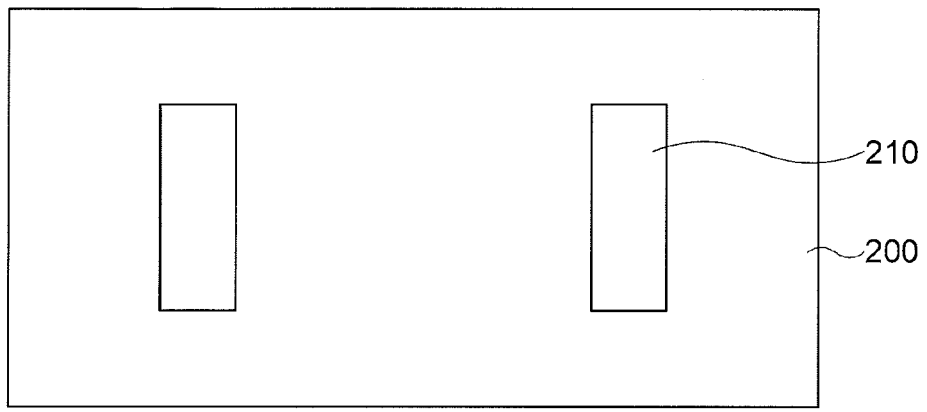
FIG. 3 is a plan view of the circuit board mounted with the multi-layered capacitor according to the exemplary embodiment of the present invention.

FIG. 2 is a cross-sectional view of an appearance in which the multi-layered capacitor 100 according to the exemplary embodiment of the present invention is mounted on a circuit board and FIG. 3 is a plan view of the circuit board mounted with the multi-layered capacitor 100 according to the exemplary embodiment of the present invention. The multi-layered capacitor 100 according to the exemplary embodiment of the present invention may be mounted on the circuit board 200 by conductively connecting the external terminal 120 with a land 210 formed in the circuit board 200.

Herein, as the circuit board 200 a multilayer circuit board, a single layer double-sided print board, and the like may be used but a kind thereof is not particularly limited and an outer layer thereof may be formed with a resist layer protecting the circuit board 200.

The land 210 is formed on an outer layer of the circuit board 200 and a resist layer of the formation part of the land 210 is opened, such that a part of the surface of the land 210 is exposed to the outside. As described above, a conductive material 220 is applied to the exposed land 210, such that the land 210 is electrically connected with the external terminal 120.

As the conductive material 220, any material conducting electricity may be used without being particularly limited and in general, a solder type is used.

As illustrated in FIG. 3, the land 210 is configured in pair to correspond to the external terminal 120 and may be disposed on the circuit board 200 at the same interval as the external terminal 120. Therefore, in the multi-layered capacitor 100 according to the exemplary embodiment of the present invention, the internal electrode 111 is mounted on the circuit board 200 in a horizontal direction, such that the internal electrode 111 and the circuit board 200 are in parallel with each other.

In the mounting structure, the vibrations due to the piezoelectricity of the ferroelectric material are maximum at the central part of the element 110, but in the multi-layered capacitor 100 according to the exemplary embodiment of the present invention, the upper end U and the lower end L of the element 110 is formed of a paraelectric material without piezoelectric characteristics to suppress the vibrations.

Herein, the relationship among a thickness $T_{UPPER}$ of the upper end U, a thickness $T_{LOWER}$ of the lower end L, and a thickness $T_{CENTER}$ of the central part C of the element 110 preferably satisfies the following Equation 1.

$$(T_{UPPER}+T_{LOWER}):T_{CENTER}=1:1 \text{ to } 1:1.5 \quad \text{[Equation 1]}$$

When a sum of the thickness $T_{UPPER}$ and $T_{LOWER}$ is relatively larger than the thickness $T_{CENTER}$ within a numerical range, the anti-vibration effect due to the ferroelectric material may be increased, but when a sum thereof is too large, a ratio of the ferroelectric material within the element is small as many and thus the capacitor capacity may be small. Therefore, it is important that the relationship among a thickness $T_{UPPER}$ of the upper end U, a thickness $T_{LOWER}$ of the lower end L has an appropriate value within the numerical value. However, the numerical range is in a range for defining an optimal value capable of achieving the effect of the exemplary embodiment of the present invention, and therefore when the exemplary embodiment of the present invention meets a targeted purpose, even though the numerical range slightly departs from the optimal range, it may be apparent to those skilled in the art that the numerical range may be permitted.

Meanwhile, the conductive material 220 serves as a vibration medium between the multi-layered capacitor 100 and the circuit board 200, and therefore as in the exemplary embodiment of the present invention when the multi-layered capacitor 100 is horizontally mounted on the circuit board 200, a height of the conductive material 220 greatly affects the reduction in vibrations delivered to the circuit board 200.

Therefore, the relationship between the thickness $T_{LOWER}$ of the lower end L of the element 110 and the height $H_{SOLDER}$ of the conductive material 220 preferably satisfy the following Equation 2.

$$T_{LOWER}:H_{SOLDER}=0.5:1 \text{ to } 1:1 \quad \text{[Equation 2]}$$

When the thickness $T_{LOWER}$ is relatively larger than the height $H_{SOLDER}$ within the numerical range, the anti-vibration may be increased due to the paraelectric material, but when the thickness $T_{LOWER}$ is too large, the ratio of the ferroelectric material is reduced as many and thus the capacitor capacity may be reduced, such that it is important that the relationship between the thickness $T_{LOWER}$ and the height $H_{SOLDER}$ has an appropriate value within the numerical range.

Figure 4:
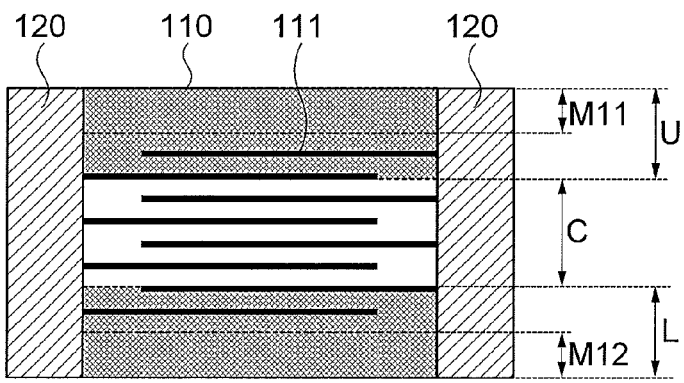
FIG. 4 is a cross-sectional view of a multi-layered capacitor according to a second exemplary embodiment of the present invention.

According to the second exemplary embodiment of the present invention, the upper end U of the element may include a margin layer M11 formed of only the paraelectric material. Alternatively, the lower end L of the element may include a margin layer M12 formed of only the paraelectric material. Alternatively, as the most exemplary embodiment, as illustrated in FIG. 4, both of the upper end U and the lower end L of the element may each include the margin layer M11 and the margin layer M12 formed of only the paraelectric material.

It is most preferable in terms of an effect that the margin layer M11 is disposed on a top part of the upper end U of the element and the margin layer M12 disposed at the lower end L of the element is also disposed on a bottom part of the lower end L of the element.

These margin layers M11 and M12 may be a single layer having a predetermined thickness and may be formed by multi-layering the dielectric layer formed of the paraelectric material in plural.

As described above, according to the second exemplary embodiment of the present invention, the margin layers M11 and M12 formed of only the paraelectric material without the internal electrode 111 are disposed at an edge of the element 110, such that the vibrations due to the ferroelectric material may be more effectively suppressed. However, according to the disposition of the margin layers M11 and M12, the multi-layered number of internal electrodes 111 is reduced, such that it is preferable to appropriately set the thickness of the margin layers M11 and M12 in consideration of the correlation between the anti-vibration effect and the capacitor capacity.

Hereinafter, a multi-layered capacitor according to a third exemplary embodiment of the present invention will be described.

Figure 5:
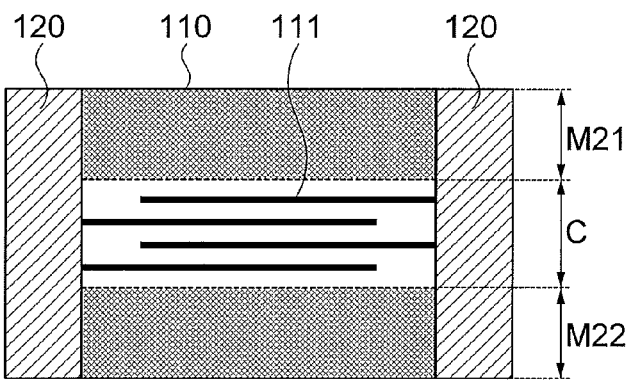
FIG. 5 is a cross-sectional view of a multi-layered capacitor according to a third exemplary embodiment of the present invention.

FIG. 5 is a cross-sectional view of a multi-layered capacitor according to a third exemplary embodiment of the present invention. Referring to FIG. 5, the third exemplary embodiment of the present invention may include the element 110 divided into a capacity portion C and margin portions M21 and M22 and the external terminals 120 disposed at both ends of the element 110.

The capacity portion C has a structure in that the dielectric layer formed of a ferroelectric material is alternately multi-layered with the internal electrode ill. Further, the margin portions M21 and M22 are formed of the paraelectric material and may be disposed at the upper and lower parts of the capacity portion C. Herein, the margin portions M21 and M22 may be a single layer having a predetermined thickness or may be formed by multi-layering the dielectric layer formed of the paraelectric material in plural.

As described above, according to the third exemplary embodiment of the present invention, the internal electrode 111 is formed only in the capacity portion C and the margin portions M21 and M22 formed of the paraelectric material are disposed at an edge of the element 110, thereby maximizing the anti-vibration effect.

However, the relationship among a thickness $T_{MARGIN21}$ of the margin portion M21, a thickness $T_{MARGIN22}$ of the margin portion M22, and a thickness $T_{CAPACITY}$ of the capacity portion C preferably satisfies the following Equation 3 in consideration of the correlation between the anti-vibration effect and the capacitor capacity.

$$T_{MARGIN21}:H_{MARGIN22}):T_{CAPACITY}=1:1 \text{ to } 1:1.5 \quad \text{[Equation 3]}$$

Further, as illustrated in FIG. 2, in order to maximize the anti-vibration effect by the conductive material 220, when the multi-layered capacitor according to the exemplary embodiment of the present invention is mounted on the circuit board 200, the relationship between the thickness $T_{MARGIN22}$ and the height $H_{SOLDER}$ of the conductive material preferably satisfies the following Equation 4.

$$T_{MARGIN22}:H_{SOLDER}=0.5:1 \text{ to } 1:1 \quad \text{[Equation 4]}$$

According to the multi-layered capacitor of the exemplary embodiments of the present invention, it is possible to improve the productivity of a product and saving the manufacturing costs by suppressing the vibrations due to the piezoelectricity of the ferroelectric material with the simpler structure.

The above detailed description exemplifies the present invention. Further, the above contents just illustrate and describe preferred embodiments of the present invention and the present invention can be used under various combinations, changes, and environments. That is, it will be appreciated by those skilled in the art that substitutions, modifications and changes may be made in these embodiments without departing from the principles and spirit of the general inventive concept, the scope of which is defined in the appended claims and their equivalents. Although the exemplary embodiments of the present invention have been disclosed for illustrative purposes, those skilled in the art will appreciate that various modifications, additions and substitutions are possible, without departing from the scope and spirit of the invention as disclosed in the accompanying claims. Therefore, the detailed description of the present invention does not intend to limit the present invention to the disclosed embodiments. Further, it should be appreciated that the appended claims include even another embodiment.

What is claimed is:

1. A multi-layered capacitor, comprising:
    an element including a dielectric layer and internal electrodes alternately layered in the dielectric layer; and
    external terminals disposed at both ends of the element,
    wherein the dielectric layer disposed at an upper end and a lower end of the element is formed of a paraelectric material and the dielectric layer disposed at a central part of the element is formed of a ferroelectric material, and
    at least one of the upper end and the lower end comprises at least one of the internal electrodes.

2. The multi-layered capacitor according to claim 1, wherein the ferroelectric material includes any one selected from a group consisting of barium titanate ($BaTiO_3$)-based ceramics, Pb-based composite perovskite-based ceramics, strontium titanate ($SrTiO_3$)-based ceramics or a mixture of two or more thereof.

3. The multi-layered capacitor according to claim 1, wherein the paraelectric material includes any one selected from a group consisting of potassium zirconate ($CaZrO_3$)-based ceramics, barium zirconate ($BaZrO_3$)-based ceramics, and strontium zirconate ($SrZrO_3$)-based ceramics or a mixture of two or more thereof.

4. The multi-layered capacitor according to claim 1, wherein the relationship among a thickness $T_{UPPER}$ of the upper end, a thickness $T_{LOWER}$ of the lower end, and a thickness $T_{CENTER}$ of the central part of the element satisfies the following Equation $$(T_{UPPER}-T_{LOWER}):T_{CENTER}=1:1 \text{ to } 1:1.5.$$

5. The multi-layered capacitor according to claim 1, wherein the upper end of the element includes an upper margin layer formed of only the paraelectric material.

6. The multi-layered capacitor according to claim 1, wherein the lower end of the element includes a lower margin layer formed of only the paraelectric material.

7. The multi-layered capacitor according to claim 1, wherein the upper end of the element includes an upper margin layer formed of only the paraelectric material and the lower end of the element includes a lower margin layer formed of only the paraelectric material.

8. The multi-layered capacitor according to claim 5, wherein the upper margin layer or the lower margin layer is formed by multi-layering the dielectric layer formed of the paraelectric material in plural.

9. A circuit board mounted with a multi-layered capacitor, wherein in a circuit board mounting structure of the multi-layered capacitor,
    the multi-layered capacitor includes an element having a dielectric layer and internal electrodes alternately layered in the dielectric layer; and external terminals disposed at both ends of the element,
    the dielectric layer disposed at an upper end and a lower end of the element is formed of a paraelectric material and the dielectric layer disposed at a central part of the element is formed of a ferroelectric material, and at least one of the upper end and the lower end comprises at least one of the internal electrodes, and the external terminals are conductively connected with lands disposed in the circuit board via a conductive material.

10. The circuit board mounted with a multi-layered capacitor according to claim 9, wherein the relationship between a thickness $T_{LOWER}$ of the lower end of the element and a height $H_{SOLDER}$ of the conductive material satisfies the following Equation $$T_{LOWER}:H_{SOLDER}=0.5:1 \text{ to } 1:1.$$

11. A multi-layered capacitor, comprising:

a capacity portion having a dielectric layer formed of a ferroelectric material and internal electrodes alternately layered in the dielectric layer;

an upper end and a lower end formed of a paraelectric material and comprising at least one of the internal electrodes, and an upper margin portion disposed in the upper end and a lower margin portion disposed in the lower end, the upper and lower margin portions being formed of the paraelectric material; and external terminals disposed at both ends of an element configured of the capacity portion and the upper and lower ends.

12. The multi-layered capacitor according to claim 11, wherein the ferroelectric material includes any one selected from a group consisting of barium titanate ($BaTiO_3$)-based ceramics, Pb-based composite perovskite-based ceramics, strontium titanate ($SrTiO_3$)-based ceramics or a mixture of two or more thereof.

13. The multi-layered capacitor according to claim 11, wherein the paraelectric material includes any one selected from a group consisting of potassium zirconate ($CaZrO_3$)-based ceramics, barium zirconate ($BaZrO_3$)-based ceramics, and strontium zirconate ($SrZrO_3$)-based ceramics or a mixture of two or more thereof.

14. The multi-layered capacitor according to claim 11, wherein the relationship among a thickness $T_{MARGIN21}$ of the upper margin portion, a thickness $T_{MARGIN22}$ of the lower margin portion, and a thickness $T_{CAPACITY}$ of the capacity portion satisfies the following Equation $$(T_{MARGIN21}+T_{MARGIN22}):T_{CAPACITY}=1:1 \text{ to } 1:1.5.$$

15. A circuit board mounted with a multi-layered capacitor, wherein in a circuit board mounting structure of the multi-layered capacitor, the multi-layered capacitor includes a capacity portion having a dielectric layer formed of a ferroelectric material and internal electrodes alternately layered in the dielectric layer; an upper end and a lower end formed of a paraelectric material and comprising at least one of the internal electrodes; and an upper margin portion disposed in the upper end and a lower margin portion disposed in the lower end, the upper and lower margin portions being formed of the paraelectric material; and external terminals disposed at both ends of an element configured of the capacity portion and the upper and lower ends, and the external terminals are conductively connected with lands disposed in the circuit board via a conductive material.

16. The circuit board mounted with a multi-layered capacitor according to claim 15, wherein the relationship between a thickness $T_{MARGIN22}$ of the lower margin portion and a height $H_{SOLDER}$ of the conductive material satisfies the following Equation $$T_{MARGIN22}:H_{SOLDER}=0.5:1 \text{ to } 1:1.$$

17. The multi-layered capacitor according to claim 6, wherein the upper margin layer or the lower margin layer is formed by multi-layering the dielectric layer formed of the paraelectric material in plural.

18. The multi-layered capacitor according to claim 7, wherein the upper margin layer or the lower margin layer is formed by multi-layering the dielectric layer formed of the paraelectric material in plural.

* * * * *